United States Patent
Cheng et al.

(10) Patent No.: US 9,917,015 B2
(45) Date of Patent: Mar. 13, 2018

(54) DUAL CHANNEL MATERIAL FOR FINFET FOR HIGH PERFORMANCE CMOS

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/424,416

(22) Filed: Feb. 3, 2017

(65) Prior Publication Data

US 2017/0148685 A1 May 25, 2017

Related U.S. Application Data

(63) Continuation of application No. 14/470,347, filed on Aug. 27, 2014, now Pat. No. 9,570,360.

(51) Int. Cl.
*H01L 21/8238* (2006.01)
*H01L 27/092* (2006.01)
(Continued)

(52) U.S. Cl.
CPC ........ *H01L 21/823821* (2013.01); *H01L 21/823807* (2013.01); *H01L 21/823878* (2013.01);
(Continued)

(58) Field of Classification Search
CPC .......... H01L 21/823807; H01L 21/823821
(Continued)

(56) References Cited

U.S. PATENT DOCUMENTS 7,198,995 B2 4/2007 Chidambarrao et al.
7,227,205 B2 6/2007 Bryant et al.
(Continued)

OTHER PUBLICATIONS

Ok, I., et al., "Strained SiGe and Si FinFETs for high performance logic with SiGe/Si stack on SOI," IEEE International Electron Devices Meeting, IEDM, Date of Conference: Dec. 6-8, 2010, pp. 34.2.1-34.2.4.
(Continued)

*Primary Examiner* — Moazzam Hossain
*Assistant Examiner* — Warren H Kilpatrick
(74) *Attorney, Agent, or Firm* — Scully, Scott, Murphy & Presser, P.C.; Louis J. Percello, Esq.

(57) ABSTRACT

Silicon fins are formed in a bulk silicon substrate and thereafter trench isolation regions are formed between each silicon fin. The silicon fins in nFET and pFET device regions are then recessed. A relaxed silicon germanium alloy fin portion is formed on a topmost surface of each recessed silicon fin portion or on exposed surface of the substrate. A compressively strained silicon germanium alloy fin portion is formed on each relaxed silicon germanium alloy fin portion within the pFET device region, and a strained silicon-containing fin portion is formed on each relaxed silicon germanium alloy fin portion within the nFET device region. Sidewall surfaces of each compressively strained silicon-containing germanium alloy fin portion and each tensile strained silicon-containing fin portion are then exposed. A functional gate structure is provided on the exposed sidewall surfaces of each compressively strained silicon-containing germanium alloy fin portion and each tensile strained silicon-containing fin portion.

20 Claims, 8 Drawing Sheets

(51) Int. Cl.
  *H01L 29/06*   (2006.01)
  *H01L 29/10*   (2006.01)
  *H01L 29/165*  (2006.01)

(52) U.S. Cl.
  CPC ...... *H01L 27/0924* (2013.01); *H01L 29/0649* (2013.01); *H01L 29/1054* (2013.01); *H01L 29/165* (2013.01)

(58) Field of Classification Search
  USPC ........................................................ 257/401
  See application file for complete search history.

(56) References Cited

U.S. PATENT DOCUMENTS

| | | | |
|---|---|---|---|
| 7,262,087 B2 | 8/2007 | Chidambarrao et al. | |
| 7,282,402 B2 | 10/2007 | Sadaka et al. | |
| 7,939,862 B2 | 5/2011 | Moroz et al. | |
| 8,169,025 B2 | 5/2012 | Bedell et al. | |
| 8,183,627 B2 | 5/2012 | Currie | |
| 8,486,776 B2 | 7/2013 | Bedell et al. | |
| 2011/0049568 A1 | 3/2011 | Lochtefeld et al. | |
| 2015/0228648 A1* | 8/2015 | Chi | H01L 27/0886 257/401 |
| 2015/0249153 A1* | 9/2015 | Morin | H01L 29/785 257/192 |

OTHER PUBLICATIONS

Kerber, P., et al., "Strained SOI FINFET SRAM Design", IEEE Electron Device Letters, Jul. 2013, pp. 876-878, vol. 34, No. 7.
List of IBM Patents or Patent Applications Treated as Related dated Feb. 3, 2017, 2 Pages.

* cited by examiner

DUAL CHANNEL MATERIAL FOR FINFET FOR HIGH PERFORMANCE CMOS

BACKGROUND

The present application relates to a non-planar semiconductor structure and a method of forming the same. More particularly, the present application relates to a semiconductor structure containing tensile strained silicon-containing fins for n-type FETs and compressive strained silicon germanium alloy fins for p-type FETs.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (finFETs) is the next step in the evolution of complementary metal oxide semiconductor (CMOS) devices. Semiconductor fin field effect transistors (FETs) can achieve higher drive currents with increasingly smaller dimensions as compared to conventional planar FETs. In order to extend these devices for multiple technology nodes, there is a need to boost the performance with high mobility channels and stressor elements.

SUMMARY

Silicon fins are formed in a bulk silicon substrate and thereafter trench isolation regions are formed between each silicon fin. The silicon fins in nFET and pFET device regions are then recessed. A relaxed silicon germanium alloy fin portion is formed on a topmost surface of each recessed silicon fin portion or on exposed surface of the substrate. A compressively strained silicon germanium alloy fin portion is formed on each relaxed silicon germanium alloy fin portion within the pFET device region, and a tensile strained silicon-containing fin portion is formed on each relaxed silicon germanium alloy fin portion within the nFET device region. Sidewall surfaces of each compressively strained silicon-containing germanium alloy fin portion and each tensile strained silicon-containing fin portion are then exposed. A functional gate structure is provided on the exposed sidewall surfaces of each compressively strained silicon-containing germanium alloy fin portion and each tensile strained silicon-containing fin portion.

In one aspect of the present application, a method of forming a semiconductor structure containing tensile strained silicon-containing fins for n-type FETs and compressive strained silicon-containing germanium alloy fins for p-type FETs is provided. The method of the present application includes forming a plurality of silicon fins extending upwards from a bulk silicon portion, wherein each silicon fin of the plurality of silicon fins is separated by a trench isolation region. A predetermined number of silicon fins of the plurality of silicon fins are then recessed to expose a surface of the bulk silicon portion in an nFET device region and a pFET device region of the bulk silicon portion or to provide a plurality of silicon fin portions in an nFET device region and a pFET device region of the bulk silicon portion. A relaxed silicon germanium alloy fin portion is formed on a topmost surface of each silicon fin portion or the exposed surface of the bulk silicon portion. A compressively strained silicon-containing germanium alloy fin portion is formed on a topmost surface of each relaxed silicon germanium alloy fin portion in the pFET device region and a tensile strained silicon-containing fin portion is formed on a topmost surface of each relaxed silicon germanium alloy fin portion in the nFET device region. Each trench isolation region is recessed to provide trench isolation structures that partially expose sidewall surfaces of each compressively strained silicon-containing germanium alloy fin portion and each tensile stained silicon fin portion.

In another aspect of the present application, a semiconductor structure that contains tensile strained silicon-containing fins for n-type FETs and compressive strained silicon-containing germanium alloy fins for p-type FETs is provided. The semiconductor structure of the present application includes a bulk silicon portion comprising an nFET device region and a pFET device region. A pFET fin stack extends upward from a surface of the bulk silicon portion within the pFET device region and comprises, from bottom to top, a relaxed silicon germanium alloy fin portion and a compressively strained silicon-containing germanium alloy fin portion. An nFET fin stack extends upward from another surface of the bulk silicon portion within the nFET device region and comprises, from bottom to top, a relaxed silicon germanium alloy fin portion and a tensile strained silicon-containing fin portion. A first set of trench isolation structures is located adjacent the pFET fin stack, wherein each of the first set of trench isolation structures covers entire sidewall surfaces of the relaxed silicon germanium alloy fin portion and a portion, but not all, of sidewall surfaces of the compressively strained silicon-containing germanium alloy fin portion. A second set of trench isolation structures is adjacent the nFET fin stack, wherein each of the second set of trench isolation structures covers entire sidewall surfaces of the relaxed silicon germanium alloy fin portion and a portion, but not all, of sidewall surfaces of the tensile strained silicon-containing fin portion.

DETAILED DESCRIPTION

Figure 1:
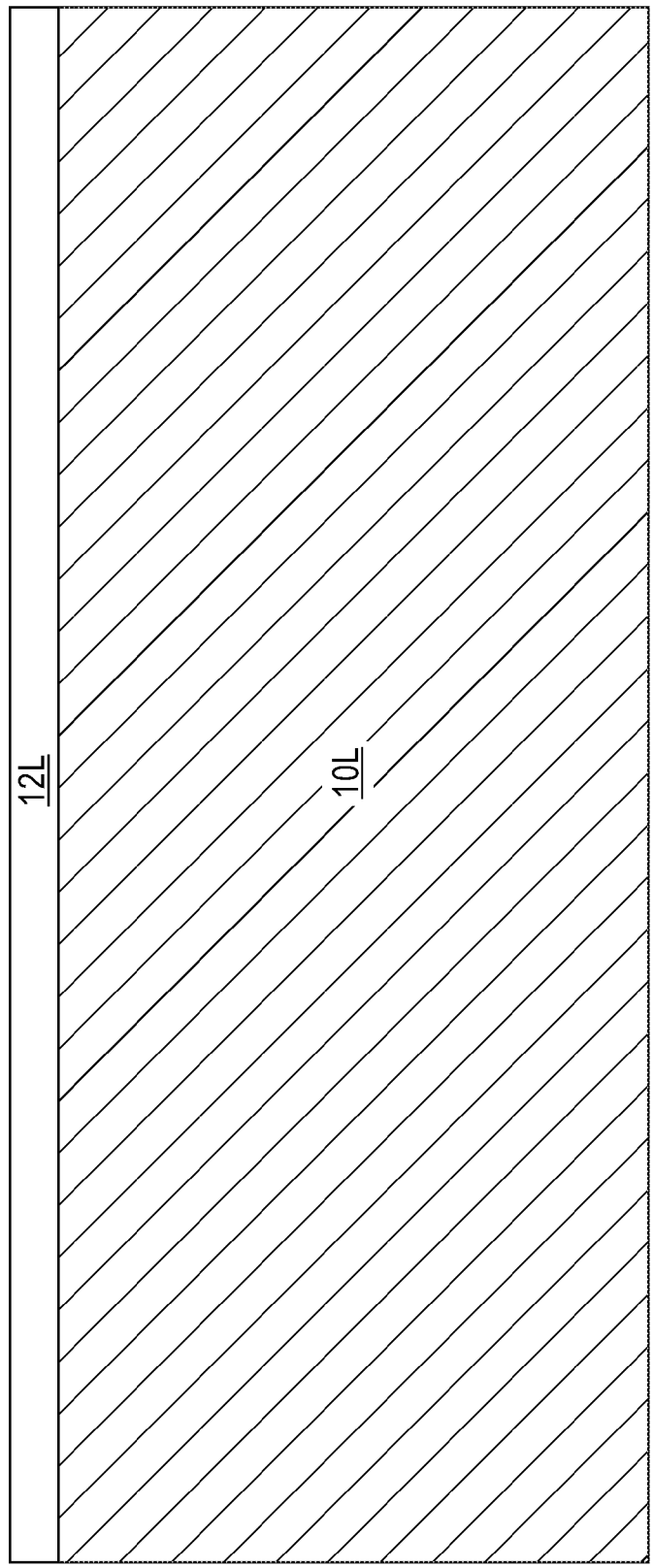
FIG. 1 is a cross sectional view of a first exemplary semiconductor structure comprising a hard mask layer located on an exposed topmost surface of a bulk silicon substrate that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements in the various embodiments of the present application are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

In one aspect of the present application, a non-planar semiconductor structure is provided that comprises tensile strained silicon-containing fins for n-type FETs and compressive strained silicon-containing germanium alloy fins for p-type FETs on a semiconductor substrate for high performance CMOS devices, while maintaining a region of unstrained silicon-containing for lower performance devices. In another aspect of the present application, a method of forming such a non-planar semiconductor structure is provided.

Referring first to FIG. 1, there is illustrated a first exemplary semiconductor structure that can be employed in accordance with an embodiment of the present application. Specifically, the first exemplary semiconductor structure shown in FIG. 1 comprises a hard mask layer 12L located on a topmost surface of a bulk silicon substrate 10L. The term "bulk" as used in conjunction with the phrase "silicon substrate" denotes that the entire substrate is comprised of silicon.

In some embodiments of the present application, the bulk silicon substrate 10L may be single crystalline silicon. In other embodiments of the present application, the bulk silicon substrate 10L may be polycrystalline silicon or amorphous silicon. The crystal orientation of the bulk silicon substrate 10L may be {100}, {110}, or {111}. Other crystallographic orientations besides those specifically mentioned can also be used in the present application.

The hard mask layer 12L that is present on a topmost surface of the bulk silicon substrate 10L is a contiguous layer that covers the entirety of the topmost surface of the bulk silicon substrate 10L. The hard mask layer 12L that is employed in the present application may include a semiconductor oxide, a semiconductor nitride and/or a semiconductor oxynitride. In one embodiment, the hard mask material that can be used in providing the hard mask layer 12L can be comprised of silicon dioxide. In another embodiment, the hard mask material that can be used in providing the hard mask layer 12L can be comprised of silicon nitride. In yet another embodiment, the hard mask material that can be used in providing the hard mask layer 12L can be a stack comprised of, in any order, silicon dioxide and silicon nitride.

In some embodiments, the hard mask material that can be used in providing the hard mask layer 12L can be formed by a deposition process such as, for example, chemical vapor deposition (CVD) and plasma enhanced chemical vapor deposition (PECVD). In other embodiments, the hard mask material that can be used in providing the hard mask layer 12L can be formed by a thermal process such as, for example, thermal oxidation and/or thermal nitridation. In yet other embodiments, the hard mask material that can be used in providing the hard mask layer 12L can be formed by a combination of a deposition process and a thermal process. The thickness of the hard mask material that can be used in providing the hard mask layer 12L can range from 2 nm to 10 nm, with a thickness from 3 nm to 6 nm being more typical.

Figure 2:
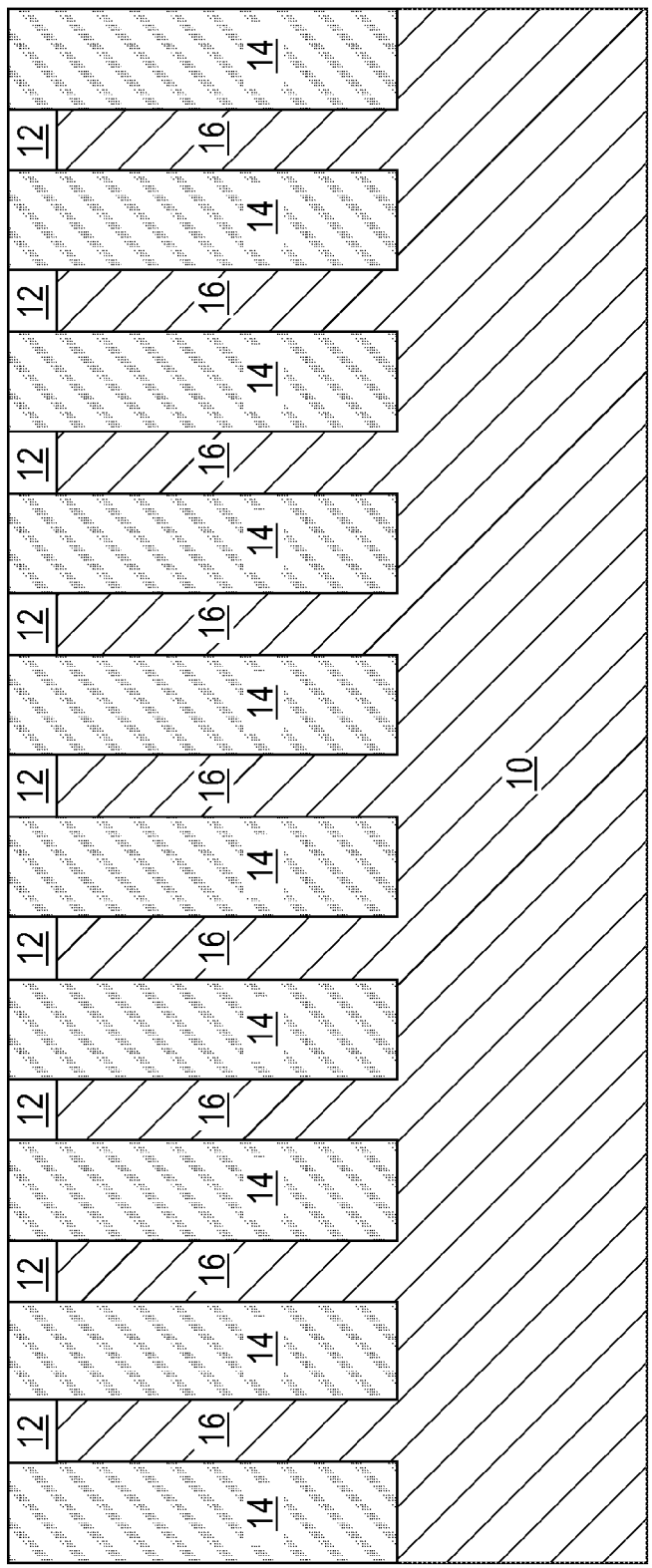
FIG. 2 is a cross sectional view of the first exemplary semiconductor structure of FIG. 1 after formation of a plurality of silicon fins that are capped with a remaining portion of the hard mask layer and formation of trench isolation regions.

Referring now to FIG. 2, there is illustrated the first exemplary semiconductor structure of FIG. 1 after formation of a plurality of silicon fins 16 that extend upward from a remaining portion of the bulk silicon substrate 10L, and formation of trench isolation regions 14. Each trench isolation region 14 is located adjacent a silicon fin of the plurality of silicon fins. The remaining portion of the bulk silicon substrate can be referred to herein as a bulk silicon portion 10. A topmost surface of each silicon fin 16 is capped with a remaining portion of the hard mask layer 12L. The remaining portion of the hard mask layer that is present on a topmost surface of each silicon fin 16 can be referred to herein as hard mask cap 12.

As is shown in FIG. 2, the topmost surface of each hard mask cap 12 is coplanar with a topmost surface of each trench isolation region 14. Also, and since each silicon fin 16 is formed within the bulk silicon substrate 10L, no material interface is present between each silicon fin 16 and the bulk silicon portion 10. Further, sidewall surfaces of each silicon fin 16 are vertically coincident with sidewall surfaces of a corresponding overlying hard mask cap 12.

The plurality of silicon fins 16 can be formed by patterning the material stack of the hard mask layer 12L and bulk silicon substrate 10L. During the patterning of material stack of the hard mask layer 12L and bulk silicon substrate 10L, a plurality of trenches are formed into the hard mask layer 12L and the bulk silicon substrate 10L. Each trench that is formed extends completely through the hard mask layer 12L but only partially into the bulk silicon substrate 10L.

As stated above, the plurality of silicon fins and the plurality of trenches can be defined by a patterning process. In one embodiment, the patterning process includes a sidewall image transfer (SIT) process. The SIT process includes forming a contiguous mandrel material layer (not shown) on the topmost surface of the hard mask layer 12L. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the surface of the hard mask layer 12L.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), and atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each silicon fin.

After formation of the dielectric spacers, the SIT process continues by removing each mandrel structure. Each mandrel structure can be removed by an etching process that is selective for removing the mandrel material as compared to the material of the dielectric spacers and hard mask layer 12L. Following the mandrel structure removal, the SIT process continues by transferring the patterned provided by the dielectric spacers into the hard mask layer 12L and then into the bulk silicon substrate 10L. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

During the patterning process a plurality of trenches is also formed into the hard mask layer 12L and the bulk silicon substrate 10L, each trench is the filled with a trench dielectric material such as, for example, an oxide. Optionally, a liner may be formed in each trench prior to trench fill, a densification step may be performed after the trench fill and a planarization process may follow the trench fill as well. The trenches that are processed in this manner provide the trench isolation regions 14. Each trench isolation region 14 is located adjacent to a silicon fin 16.

As used herein, a "fin" refers to a contiguous structure including a semiconductor material, in the present case silicon, and including a pair of vertical sidewalls that are parallel to each other. As used herein, a surface is "vertical" if there exists a vertical plane from which the surface does not deviate by more than three times the root mean square roughness of the surface. Each silicon fin 16 that is formed is comprised of unstrained silicon-containing.

In one embodiment of the present application, each silicon fin 16 has a height from 10 nm to 100 nm, and a width from 4 nm to 30 nm. In another embodiment of the present application, each silicon fin 16 has a height from 15 nm to 50 nm, and a width from 5 nm to 12 nm. Each silicon fin 16 is spaced apart from its nearest neighboring silicon fin 16 by the width of the trench isolation region 14 that is present between the two silicon fins 16. Also, each silicon fin 16 is oriented parallel to each other.

Figure 3:
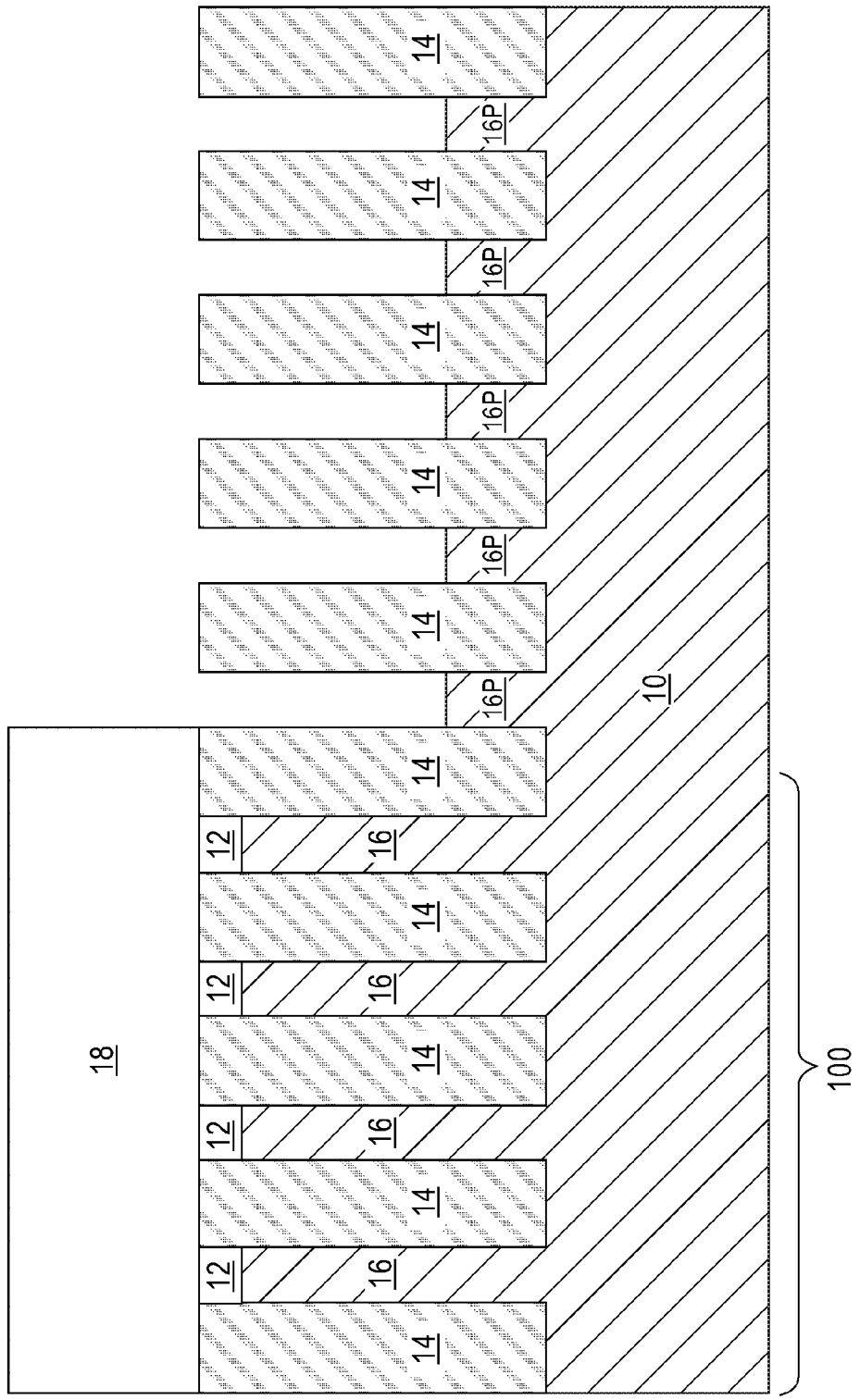
FIG. 3 is a cross sectional view of the first exemplary semiconductor structure of FIG. 2 after selectively removing the remaining hard mask layer portions and recessing exposed silicon fins from a predetermined area of the structure.

Referring now to FIG. 3, there is illustrated the first exemplary semiconductor structure of FIG. 2 after selectively removing the remaining hard mask layer portions (i.e., the hard mask cap 12) and recessing exposed silicon fins 16 from a predetermined area of the structure. The recessed silicon fins are labeled as element 16p in the drawings of the present application. Each recessed silicon fin is hereinafter referred to herein as a silicon fin portion 16p.

The structure shown in FIG. 3 can be formed by first providing a block mask 18 on a predetermined area 100 of the structure. The predetermined area 100 can be an area in which lower performance devices can be subsequently formed. The block mask 18 can be comprised of a photoresist material, a hard mask material that differs from that of the hard mask material that provides the hard mask layer 12L and each hard mask cap 12, or a combination thereof. The block mask 18 can be formed by deposition and patterning. The patterning may include only lithography or a combination of lithography and etching can be used in defining the block mask 18.

After forming block mask 18 on the predetermined area 100 of the structure, the exposed hard mask caps 12 that are not protected, i.e., covered, by the block mask 18, are removed from each of the silicon fins 16. The removal of the exposed hard mask caps 12 can be performed utilizing a selective etching process. By "selective etching" it is meant an etching process that removes one material at a greater rate than other materials. In one example and when hard mask layer 12L is silicon nitride, and the trench dielectric material is silicon dioxide, and the block mask 18 is also silicon dioxide, hot phosphoric acid can be employed to remove the exposed hard mask caps 12 that are not protected by block mask 18.

The selective removal of the exposed hard mask caps 12 exposes a topmost surface of each silicon fin 16 in the area of the structure not protected by the block mask 18. Each exposed fin structure 16 is then recessed utilizing an etching process that is selective in removing silicon. In one embodiment, a reactive ion etch (i.e., RIE) can be used to recess each silicon fin 16 that is not protected by the block mask 18. In some embodiments (as shown), the exposed silicon fins 16 are partially recessed. In other embodiments (not shown), the entirety of exposed silicon fins 16 is removed to expose a surface of the bulk silicon portion 10.

Each silicon fin portion 16p that is formed has a height that is less than the height of the remaining silicon fins 16 that are protected by the block mask 18. In one embodiment, the height of each silicon fin portion 16p is greater than 0 nm to 10 nm. Other heights for the silicon fin portions 16p are possible so long as the height of silicon fin portion 16p is less than the height of the remaining silicon fins 16 that are protected by the block mask 18. In accordance with the present application, each silicon fin portion 16p has a topmost surface that is vertically offset and located above a bottommost surface of each trench isolation region 14.

Figure 4:
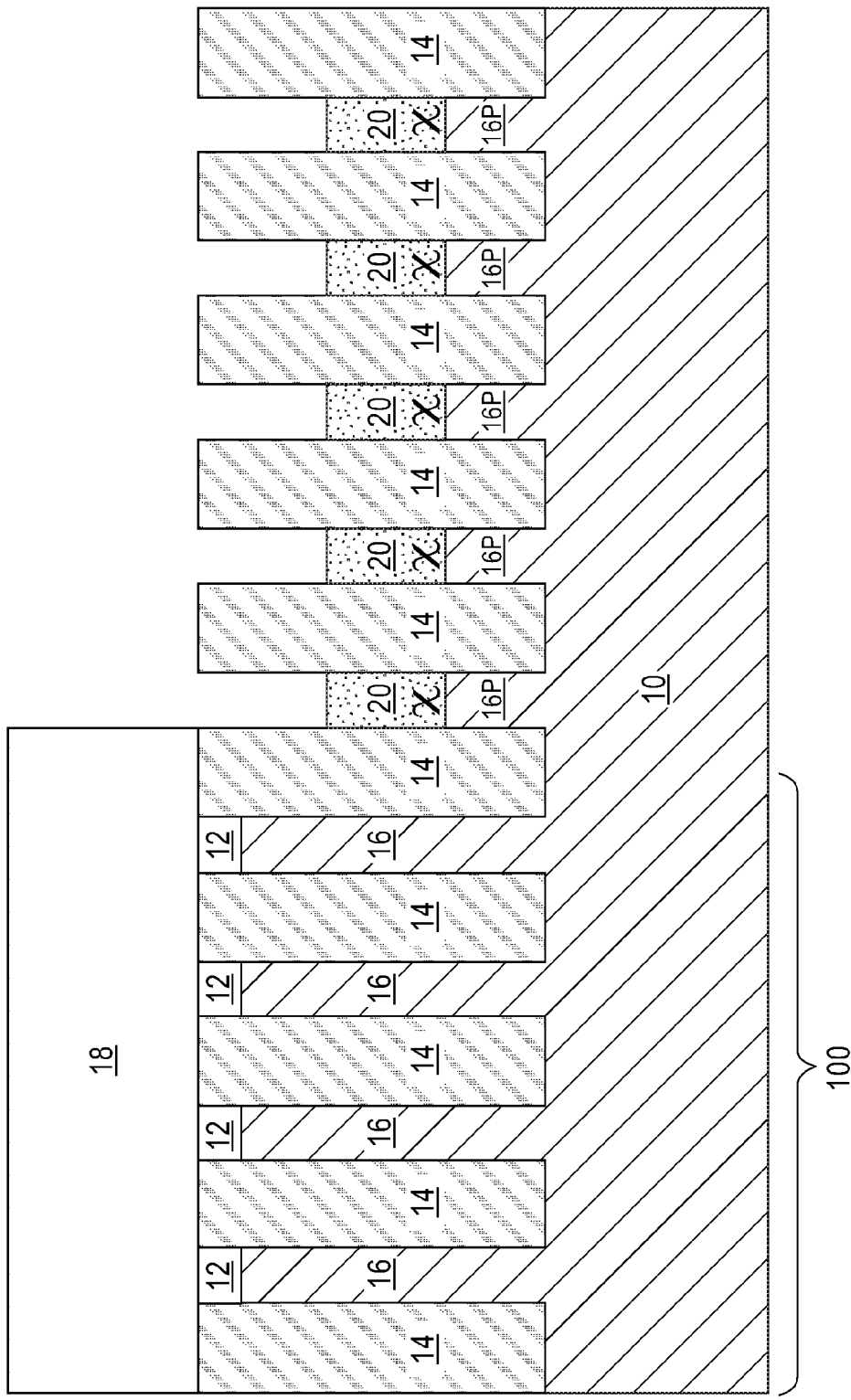
FIG. 4 is a cross sectional view of the first exemplary semiconductor structure of FIG. 3 after forming a relaxed silicon germanium alloy fin portion on a topmost surface of each recessed silicon fin.

Referring now to FIG. 4, there is illustrated the first exemplary semiconductor structure of FIG. 3 after forming a relaxed silicon germanium alloy fin portion 20 on a topmost surface of each silicon fin portion 16p. In embodiments in which the entire silicon fin is recessed, the relaxed silicon germanium alloy fin portion 20 is formed on the exposed surface of bulk silicon portion 10. During the formation of the relaxed silicon germanium alloy fin portion 20, block mask 18 remains in predetermined area 100. The formation of a relaxed silicon germanium alloy fin portion 20 on topmost surface of each silicon fin portion 16p (or the exposed surface of bulk silicon portion 10) provides a bilayer lattice mismatched heterostructure in the area of the structure not protected by the block mask 18.

The term "relaxed silicon germanium alloy" is used throughout the present application to denote a silicon germanium alloy material that has a relaxation value of 90% or greater. Each relaxed silicon germanium alloy fin portion 20 that is formed can have a germanium content of 20 atomic percent or greater and the remainder being silicon. Each relaxed silicon germanium alloy portion 20 may be compositional graded or compositional ungraded.

Each relaxed silicon germanium alloy fin portion 20 that is formed has a bottommost surface that directly contacts the topmost surface of a corresponding silicon fin portion 16p or an exposed surface of the bulk silicon portion 10, and a topmost surface that is located beneath a topmost surface of each silicon fin 16 that is protected by block mask 18. The height of each relaxed silicon germanium alloy fin portion 20 has to be greater than the critical thickness of the respective silicon germanium concentration of 20 atomic percent germanium to allow full relaxation. In the embodiment that is illustrated, each relaxed silicon germanium alloy fin portion 20 has sidewall surfaces that are vertically coincident with sidewall surfaces of the silicon fin portion 16p.

Each relaxed silicon germanium alloy fin portion 20 that is formed includes a lower portion (indicated by "χ" in the drawings) having a first defect density and an upper portion (not including the "χ") having a second defect density that is less than the first defect density.

Each relaxed silicon germanium alloy fin portion 20 that is provided can be formed utilizing an epitaxial semiconductor regrowth process such as is described, for example, in U.S. Patent Application Publication No. 2011/0049568 to Lochtefeld et al., the entire content and disclosure of which is incorporated herein by reference. Notably, and since an epitaxial semiconductor regrowth process is used in forming each relaxed silicon germanium alloy fin portion 20, each relaxed silicon germanium alloy fin portion 20 has a same crystalline characteristic as the semiconductor material of the deposition surface. Thus, in the present application, each relaxed silicon germanium alloy fin portion 20 has an epitaxial relationship, i.e., same crystal orientation, with the underlying silicon fin portion 16p or the underlying exposed surface of the bulk silicon portion 10.

In some embodiments of the present application, the selected crystallographic direction of the relaxed silicon germanium alloy fin portion 20 is aligned with at least one propagation direction of threading dislocations in the opening in which each relaxed silicon germanium alloy fin portion 20 is formed. Threading dislocations in this region may substantially terminate at the sidewall of the neighboring trench isolation regions 14. In one embodiment of the present application, the selected crystallographic direction of the silicon fin portion 16p is aligned with direction of propagation of threading dislocations in each relaxed silicon germanium alloy fin portion 20. In certain embodiments, the orientation angle ranges from about 30 to about 60 degrees, for example, is about 45 degrees to such crystallographic direction. As mentioned above, the surface of the semiconductor layer may have (100), (110), or (111) crystallographic orientation. In some embodiments, the selected crystallographic direction is substantially aligned with a <110> crystallographic direction of the silicon fin portion 16p.

Each relaxed silicon germanium alloy fin portion 20 can be formed by selective epitaxial growth in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), metal-organic CVD (MOCVD) or by atomic layer deposition (ALD). In the CVD process, selective epitaxial growth typically includes introducing a source gas into the chamber. The source gas may include at least one precursor gas and a carrier gas, such as, for example hydrogen. The reactor chamber is heated, such as, for example, by RF-heating. The growth temperature in the chamber may range from 250° C. to 900° C. The growth system also may utilize low-energy plasma to enhance the layer growth kinetics. The epitaxial growth system may be a single-wafer or multiple-wafer batch reactor.

Figure 5:
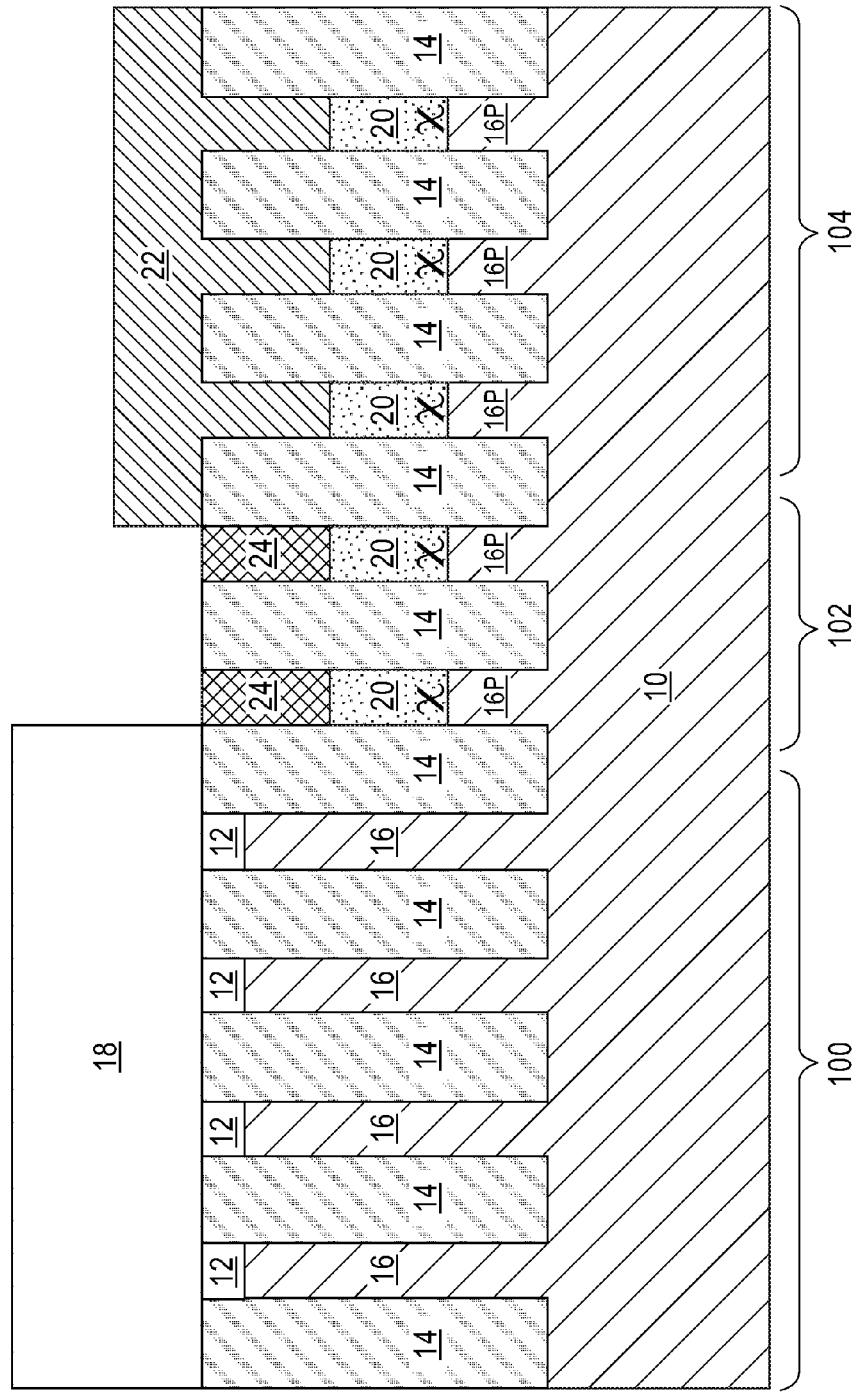
FIG. 5 is a cross sectional view of the first exemplary semiconductor structure of FIG. 4 after forming a compressively strained silicon-containing germanium alloy fin portion on a topmost surface of the relaxed silicon germanium alloy fin portion within a pFET device region of the structure.

Referring now to FIG. 5, there is illustrated the first exemplary semiconductor structure of FIG. 4 after forming a compressively strained silicon-containing germanium alloy fin portion 24 on a topmost surface of each relaxed silicon germanium alloy fin portion 20 within a pFET device region 102 of the structure. The term "compressively strained silicon-containing germanium alloy" is used throughout the present application to denote a silicon germanium material having an unstrained (relaxed) lattice constant which is larger than the unstrained lattice constant of the underlying relaxed silicon germanium alloy fin portion 20. Thus, the compressively strained silicon-containing germanium alloy fin portion 24 must have a larger amount of germanium than the underlying relaxed silicon germanium alloy fin portion 20. Each compressively strained silicon-containing germanium alloy fin portion 24 may be compositional graded or compositional ungraded. Since the compressively strained silicon-containing germanium alloy fin portion 24 is grown from the surface of the relaxed silicon germanium alloy fin portion 20, the compressively strained silicon-containing germanium alloy fin portion 24 will grow with a lattice constant that is the same as the relaxed silicon germanium alloy fin portion 20, leading to a compressive strain in the material. The strained silicon-containing germanium material must be below the critical thickness to maintain the strain and not to relax.

Each compressively strained silicon-containing germanium alloy fin portion 24 that is formed has a bottommost surface that directly contacts the topmost surface of a relaxed silicon germanium alloy fin portion 20, and a topmost surface that is coplanar with a topmost surface of each hard mask cap 12 that is protected by block mask 18 and a topmost surface of each trench isolation region 14. Each compressively strained silicon-containing germanium alloy fin portion 24 that is formed has an epitaxial relationship, i.e., same crystal orientation, with the underlying relaxed silicon germanium alloy fin portion 20.

Each compressively strained silicon-containing germanium alloy fin portion 24 has sidewall surfaces that are vertically coincident with sidewall surfaces of the relaxed silicon germanium alloy fin portion 20 and, if present, sidewall surfaces of the silicon fin portion 16p. Collectively and in one embodiment, a vertical stack of, from bottom to top, a single silicon fin portion 16p, a single relaxed silicon germanium alloy fin portion 20, and a single compressively strained silicon-containing germanium alloy fin portion 24 provides a pFET fin stack of the present application. Collectively and in another embodiment, a vertical stack of, from bottom to top, a single relaxed silicon germanium alloy fin portion 20, and a single compressively strained silicon-containing germanium alloy fin portion 24 provides a pFET fin stack of the present application Each compressively strained silicon-containing germanium alloy fin portion 24 is formed by first providing an nFET block mask 22 over the area 104 of the structure in which nFET devices will be subsequently formed. Block mask 18 can remain within the predetermined area 100 of the structure. In one embodiment of the present application, nFET block mask 22 can be comprised of a same block mask material that is used in providing block mask 18. In another embodiment of the present application, nFET block mask 22 can be comprised of a different block mask material that is used in providing block mask 18. In one example, block mask 18 may comprise silicon nitride, while block mask 22 may comprise a photoresist material. nFET block mask 22 can be formed utilizing the processing techniques mentioned above in forming block mask 18. As is shown, nFET block mask 22 has a bottommost surface that directly contacts the uppermost surface of a relaxed silicon germanium alloy fin portion 20 within the nFET device region 104.

After providing nFET block mask 22, each compressively strained silicon-containing germanium alloy fin portion 24 is formed within the pFET device region 102 that is void of either block mask 18 or nFET block mask 22. Each compressively strained silicon-containing germanium alloy fin portion 24 that is formed on the topmost surface of relaxed silicon germanium alloy fin portion 20 in the pFET device region 102 can be formed by an epitaxial deposition process.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming epitaxial semiconductor material include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for epitaxial deposition process typically ranges from 250° C. to 900° C. Although higher temperature typically results in faster deposition, the faster deposition may result in crystal defects and film cracking.

A number of different source gases may be used for the deposition of the each compressively strained silicon-containing germanium alloy fin portion 24. In some embodiments, the source gas for the deposition of the each compressively strained silicon-containing germanium alloy fin portion 24 include a mixture of a silicon containing gas source and a germanium containing gas source. In other embodiments, the source gas for the deposition of the each compressively strained silicon-containing germanium alloy fin portion 24 includes silicon and germanium containing source gas. Carrier gases like hydrogen, nitrogen, helium and argon can be used.

After the epitaxial deposition of each compressively strained silicon-containing germanium alloy fin portion 24, the nFET block mask 22 can be selectively removed from the structure. In one embodiment, and when the nFET block mask 22 is comprised of a photoresist material, ashing may be used to remove the photoresist material that provides the nFET block mask 22. In one embodiment, and when the nFET block mask 22 is comprised of a hard mask material, an etching process may be used to remove the hard mask material that provides the nFET block mask 22.

Figure 6:
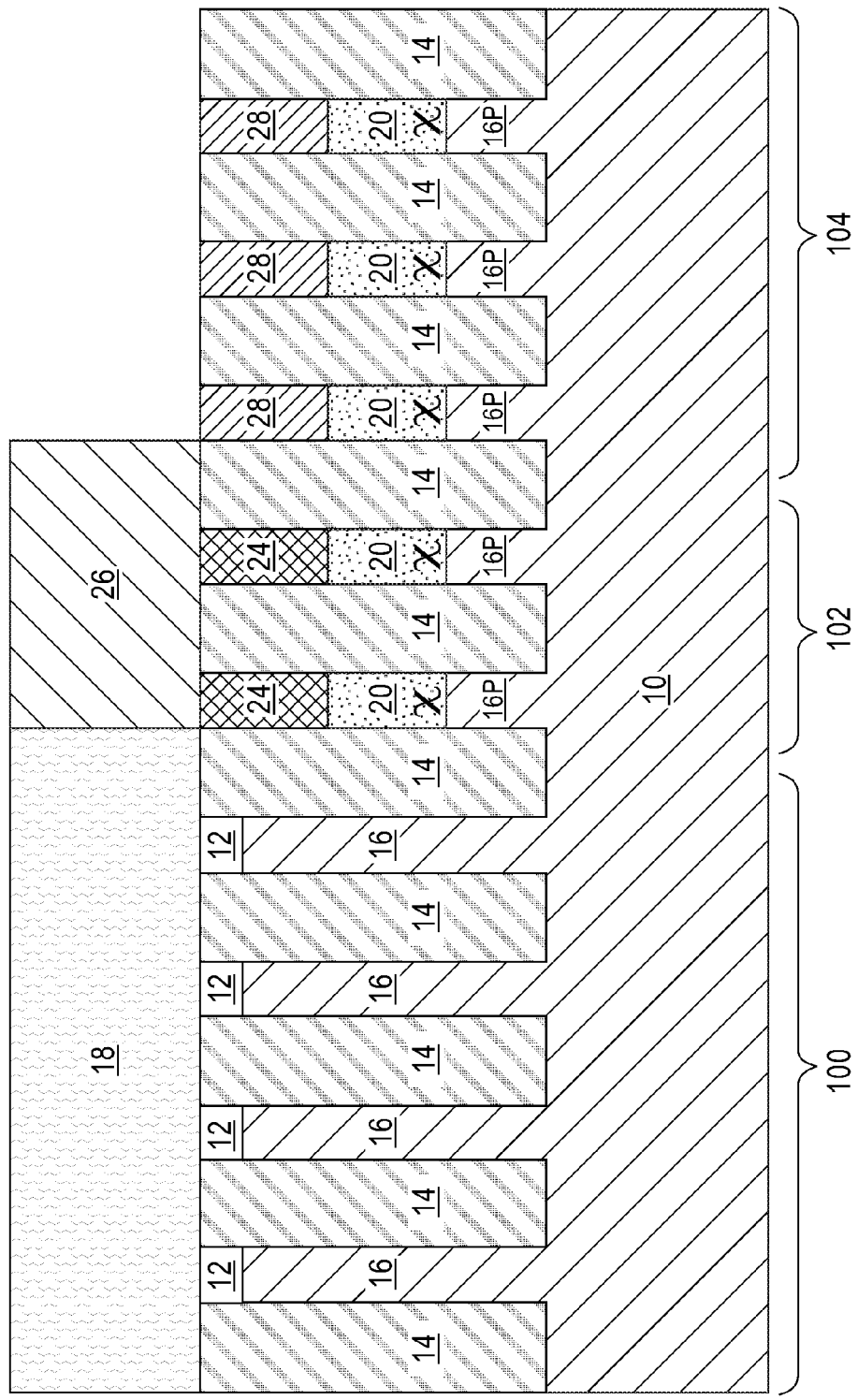
FIG. 6 is a cross sectional view of the first exemplary semiconductor structure of FIG. 5 after forming a tensile strained silicon-containing fin portion on a topmost surface of the relaxed silicon germanium alloy portion within an nFET device region of the structure.

Referring now to FIG. 6, there is illustrated the first exemplary semiconductor structure of FIG. 5 after forming a tensile strained silicon-containing fin portion 28 on a topmost surface of each relaxed silicon germanium alloy fin portion 20 within the nFET device region 104 of the structure. The term "tensile strained silicon-containing fin portion" is used throughout the present application to denote a silicon-containing material having an unstrained (relaxed) lattice constant which is smaller than the unstrained lattice constant of the underlying relaxed silicon germanium alloy fin portion 20. The term "silicon-containing" when used in conjunction with the term tensile strained silicon-containing fin portion 28 denotes a material that contains unalloyed (i.e., pure) silicon, or a silicon germanium alloy having a germanium content that is less than the germanium content of the relaxed silicon germanium alloy fin portion 20. Since the silicon-containing material grows from the surface of the relaxed silicon germanium alloy fin portion 20, the silicon-containing material will grow with the lattice constant of the relaxed silicon germanium alloy fin portion 20, leading to a tensile strain in the silicon-containing material. The silicon-containing material that is formed must be below the critical thickness to maintain the strain and not to relax.

Although the present application describes and illustrates the formation of the compressively strained silicon-containing germanium alloy fin portion 24 prior to the forming the tensile strained silicon-containing fin portion 28, the order of forming each compressively strained silicon-containing germanium alloy fin portion 24 and each tensile strained silicon-containing fin portion 28 may be reversed. Thus, and in some embodiments, each tensile strained silicon-containing fin portion 28 may be formed prior to forming each compressively strained silicon-containing germanium alloy fin portion 24.

Each tensile strained silicon-containing fin portion 28 that is formed has a bottommost surface that directly contacts the topmost surface of a relaxed silicon germanium alloy fin portion 20, and a topmost surface that is coplanar with a topmost surface of each hard mask cap 12 that is protected by block mask 18 and a topmost surface of each trench isolation region 14. Each tensile strained silicon-containing fin portion 28 that is formed has an epitaxial relationship, i.e., same crystal orientation, with the underlying relaxed silicon germanium alloy fin portion 20.

Each tensile strained silicon-containing fin portion 28 has sidewall surfaces that are vertically coincident with sidewall surfaces of the relaxed silicon germanium alloy fin portion 20 and, if present, sidewall surfaces of the silicon fin portion 16p. Collectively and in one embodiment, a vertical stack of, from bottom to top, a single silicon fin portion 16p, a single relaxed silicon germanium alloy fin portion 20, and a single tensile strained silicon-containing fin portion 28 provides an nFET fin stack of the present application. Collectively and in another embodiment, a vertical stack of, from bottom to top, a single relaxed silicon germanium alloy fin portion 20, and a single tensile strained silicon-containing fin portion 28 provides an nFET fin stack of the present application.

Each tensile strained silicon-containing fin portion 28 is formed by first providing a pFET block mask 26 over the area 102 of the structure in which pFET devices will be subsequently formed. Block mask 18 can remain within the predetermined area 100 of the structure. In one embodiment of the present application, pFET block mask 26 can be comprised of a same block mask material that is used in providing block mask 18. In another embodiment of the present application, pFET block mask 26 can be comprised of a different block mask material that is used in providing block mask 18. In one example, block mask 18 may comprise silicon nitride, while pFET block mask 26 may comprise a photoresist material. pFET block mask 26 can be formed utilizing the processing techniques mentioned above in forming block mask 18. As is shown, pFET block mask 26 has a bottommost surface that directly contact the uppermost surface of a compressively strained silicon-containing germanium alloy fin portion 24 within the pFET device region 102.

After providing pFET block mask 26, each tensile strained silicon-containing fin portion 28 is formed within the nFET device region 104 that is void of either block mask 18 or pFET block mask 26. Each tensile strained silicon-containing fin portion 28 that is formed on the topmost surface of relaxed silicon germanium alloy fin portion 20 in the nFET device region 104 can be formed by an epitaxial deposition process such as that defined above for epitaxially deposition of the compressively strained silicon-containing germanium alloy fin portion 24.

A number of different silicon source gases may be used for the deposition of the each tensile strained silicon-containing fin portion 28. Carrier gases like hydrogen, nitrogen, helium and argon can be used.

After the epitaxial deposition of each tensile strained silicon-containing fin portion 28, the nFET block mask 22 and block mask 18 can be selectively removed from the structure. Block mask 18 and pFET block mask 26 can be removed simultaneously or one after the other. Any conventional block mask material removal process such as, for example, etching, ashing or a combination thereof can be used in removing block mask 18 and pFET block mask 26 from the structure.

Figure 7:
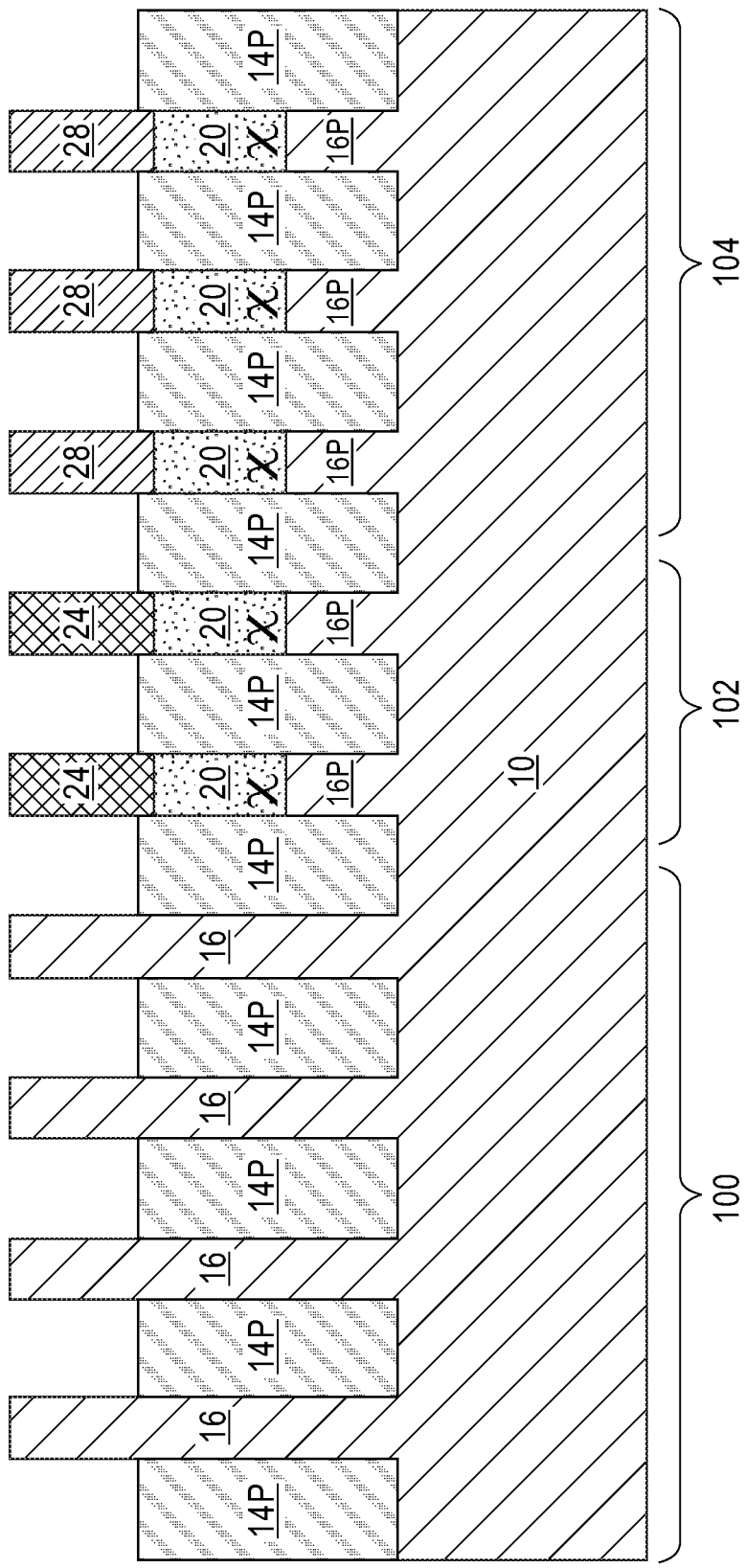
FIG. 7 is a cross sectional view of the first exemplary semiconductor structure shown in FIG. 6 after recessing the trench isolation regions.

Referring now to FIG. 7, there is illustrated the first exemplary semiconductor structure shown in FIG. 6 after recessing the trench isolation regions 14 forming trench isolation structures 14p. The recessing process comprises an etching process that is selective in removing trench dielectric material. In some embodiments, the recessing process may also remove the hard mask caps 12 from each silicon fin 16 within area 100 of the structure. Alternatively, the hard mask caps 12 may be removed in a separate step from the recessing of the trench isolation regions 14 utilizing another etching process that is selective in removing the hard mask material that provides each hard mask cap 12. A planarization process such as chemical mechanical planarization may also be performed to ensure coplanarity between silicon fins 16, compressively silicon germanium alloy fin portions 24 and tensile strained silicon-containing fin portions 28 with the various device regions 100, 102, and 104.

The aforementioned steps expose a topmost surface of each silicon fin 16 within region 100, a topmost surface of each compressively strained silicon-containing germanium alloy fin portion 24 of each pFET fin stack within pFET device region 102 and a topmost surface of each tensile strained silicon-containing fin portion 28 of each nFET fin stack within nFET device region 104.

As is shown, portions of the sidewall surfaces of each silicon fin 16 within region 100, portions of the sidewall surfaces of each compressively strained silicon-containing germanium alloy fin portion 24 of each pFET fin stack within pFET device region 102 and portions of the sidewall surfaces of each tensile strained silicon-containing fin portion 28 of each nFET fin stack within nFET device region 104 are exposed. As is also shown, trench isolation structures 14p remain surrounding a portion of silicon fin 16 within region 100, a bottommost portion of each compressively strained silicon-containing germanium alloy fin portion 24 of each pFET fin stack within pFET device region 102 and a bottommost portion each tensile strained silicon-containing fin portion 28 of each nFET fin stack within nFET device region 104. As is further shown, entire sidewall surfaces of each relaxed silicon germanium alloy fin portion 20 and entire sidewall surfaces of each silicon fin portion 16p within the pFET device region 102 and the nFET device region 104 are surrounded by a trench isolation structure 14p.

Figure 8:
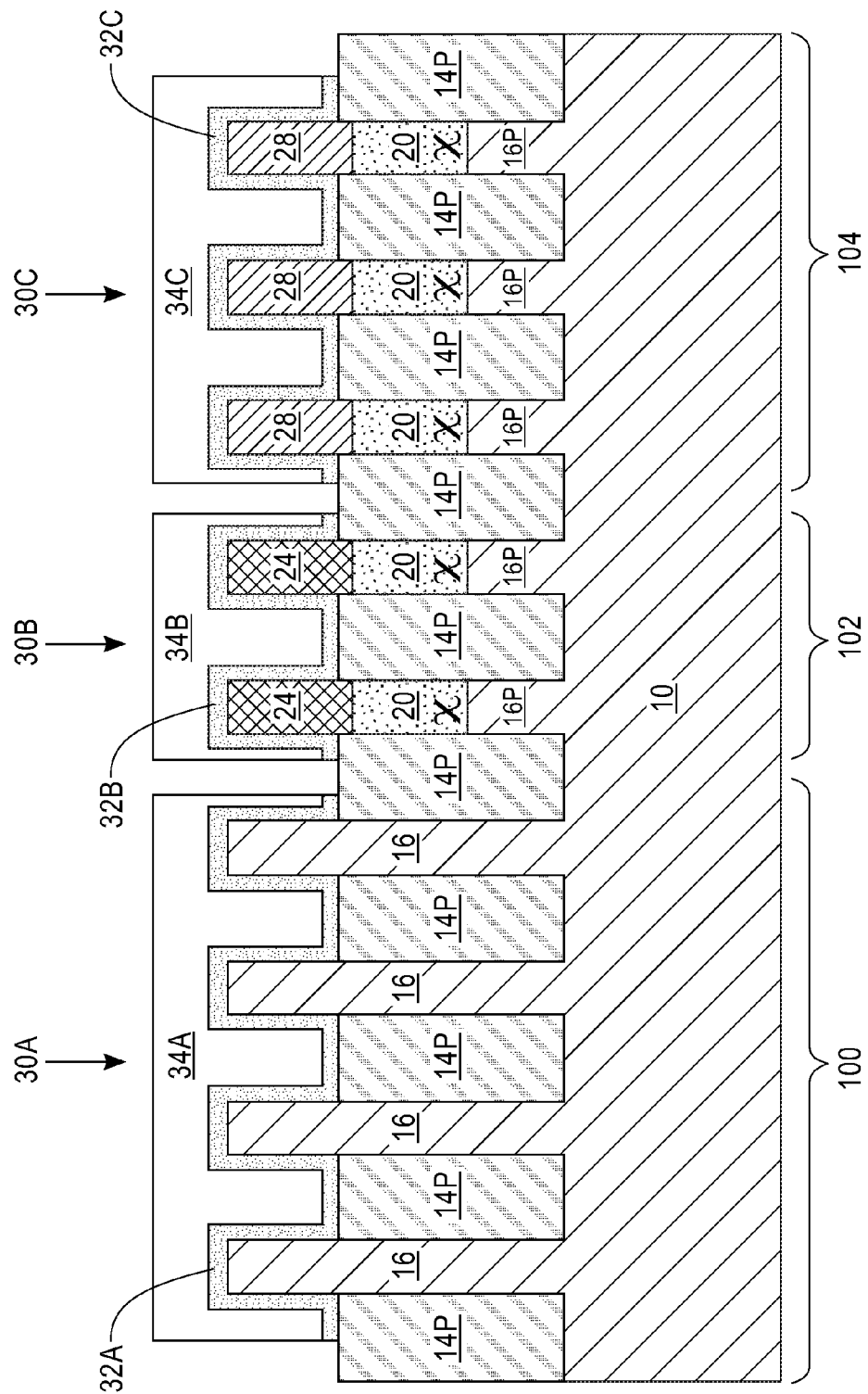
FIG. 8 is a cross sectional view of the first exemplary semiconductor structure of FIG. 7 after forming of a gate structure in each define region of the structure.

Referring now to FIG. 8, there is illustrated the first exemplary semiconductor structure of FIG. 7 after forming of a gate structure in each device regions, i.e., 100, 102 and 104, of the structure. The gate structure within device region 100, which may be referred to herein as a low leakage gate structure, is labeled as element 30A and it contains a gate dielectric material portion 32A and a gate conductor material portion 34A. The gate structure within pFET device region 102, which may be referred to herein as a pFET gate structure, is labeled as element 30B and it contains a gate dielectric material portion 32B and a gate conductor material portion 34B. The gate structure within nFET device region 104, which may be referred to herein as an nFET gate structure, is labeled as element 30C and it contains a gate dielectric material portion 32C and a gate conductor material portion 34C.

As shown, the gate structure 30A surrounds an exposed portion of silicon fin 16 in device region 100, gate structure 30B surrounds an exposed portion of the compressively relaxed silicon germanium fin portion 24 within the pFET device region 102, while gate structure 30C surrounds an exposed portion of the tensile strained silicon-containing fin portion 28 within the nFET device region 104.

In some embodiments, each gate dielectric material portions 32A, 32B and 32C may comprise a same gate dielectric material. In other embodiments, each gate dielectric material portions 32A, 32B and 32C may comprise a different gate dielectric material. In yet other embodiments, at least two of gate dielectric material portions 32A, 32B and 32C may comprise a same gate dielectric material, while the other gate dielectric material portion may comprise a gate dielectric material that is different from the two gate dielectric material portions having a same gate dielectric material.

In some embodiments, each gate conductor material portions 34A, 34B and 34C may comprise a same gate conductor material. In other embodiments, each gate conductor material portions 34A, 34B and 34C may comprise a different gate conductor material. In yet other embodiments, at least two of gate conductor material portions 34A, 34B and 34C may comprise a same gate conductor material, while the other gate conductor material portions may comprise a gate conductor material that is different from the two gate conductor material portions having a same gate conductor material.

Gate structures 30A, 30B and 30C can be formed utilizing a gate-first process, a gate-last process or a combination of a gate first process and a gate last process. In a gate first process, the gate structure is formed first followed by the source/drain regions and optionally, merging of each of the source/drain regions.

In a gate last process, the gate structure is formed after source/drain regions are formed. In such a process, a sacrificial gate material is formed straddling an exposed portion of a semiconductor fin, i.e., at least one of silicon fin 16, compressively strained silicon-containing germanium alloy fin portion 24 and tensile strained silicon-containing fin portion 28, and on one side of the sacrificial gate structure and then drain regions can be formed in exposed portions of each semiconductor fin and on the other side of the gate. An epitaxial growth process can be used to deposit an epitaxial semiconductor material that can merge each of the source/drain regions. Next, the sacrificial gate structure may be replaced with a gate structure as defined above. The gate structures 30A, 30B and 30C may be referred to as a functional gate structure. The term "functional gate structure" is used throughout the present application as a permanent gate structure used to control output current (i.e., flow of carriers in the channel) of a semiconducting device through electrical or magnetic fields.

The gate dielectric material that provides each gate dielectric material portions 32A, 32B and 32C can be an oxide, nitride, and/or oxynitride. In one example, the gate dielectric material that provides each gate dielectric material portions 32A, 32B and 32C can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed.

The gate dielectric material used in providing each gate dielectric material portions 32A, 32B and 32C can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming each gate dielectric material portions 32A, 32B and 32C. When a different gate dielectric material is used for the gate dielectric material portions 32A, 32B and 32C, block mask technology can be used. In one embodiment of the present application, the gate dielectric material used in providing each gate dielectric material portions 32A, 32B and 32C can have a thickness in a range from 1 nm to 10 nm. Other thicknesses that are lesser than or greater than the aforementioned thickness range can also be employed for the gate dielectric material.

Each gate conductor portion 34A, 34B and 34C comprises a gate conductor material. The gate conductor material used in providing each gate conductor portion 34A, 34B and 34C can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor material portion 34C and optionally gate conductor material portion 34A may comprise an nFET gate metal. In other embodiments, gate conductor material portion 34B and optionally gate conductor material portion 34A may comprise a pFET gate metal.

The gate conductor material used in providing each gate conductor portion 34A, 34B and 34C can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed.

When a different gate conductor material is used for gate conductor portion 34A, 34B and 34C, block mask technology can be used. In one embodiment, the gate conductor material used in providing each gate conductor portion 34A, 34B and 34C has a thickness from 1 nm to 100 nm. Other thicknesses that are lesser than or greater than the aforementioned thickness range can also be employed for the gate conductor material used in providing each gate conductor portion 34A, 34B and 34C.

Each gate conductor material and each gate material portion may be patterned after formation thereof forming gate structures 30A, 30B and 30C. A dielectric spacer material may then be formed on each gate structure 30A, 30B and 30C and thereafter the dielectric spacer material can be etched to form dielectric spacers on exposed sidewall surfaces of each gate structure 30A, 30B and 30C.

Source/drain regions (not shown) can be formed in portions of each semiconductor fin, i.e., silicon fin 16, compressively strained silicon-containing germanium alloy fin portion 24 or tensile strained silicon-containing fin portion 28, that are not covered by either the gate structure or the dielectric spacer. The source/drain regions can be formed by introducing a dopant into the exposed portions of each semiconductor fin, i.e., silicon fin 16, compressively strained silicon-containing germanium alloy fin portion 24 or tensile strained silicon-containing fin portion 28, which are not covered by either the gate structure or the dielectric spacer. The dopant can be n-type or p-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. In some embodiments, the dopant may be introduced into the exposed portions of each semiconductor fin, i.e., silicon fin 16, compressively strained silicon-containing germanium alloy fin portion 24 or tensile strained silicon-containing fin portion 28, by ion implantation, plasma doping or gas phase doping. The concentration of dopants used in providing the source/drain regions can range from 5e18 atoms/$cm^3$ to 1.5e21 atoms/$cm^3$.

In some embodiments, the source/drain regions can be merged. The merging of the source/drain regions can be provided by growing an epitaxial semiconductor material utilizing an epitaxial growth process as defined above. A dopant can be introduced into the epitaxial semiconductor material that is used to merge the various regions together either during the epitaxial growth process itself, or following the epitaxial growth process by utilizing gas phase doping. The dopant concentration of each of the merged regions is typically from 5e18 atoms/cm$^3$ to 1.5e21 atoms/cm$^3$.

In some embodiments of the present application, region 100 can be omitted from the final structure.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:

1. A method of forming a semiconductor structure comprising:
    forming a plurality of silicon fins extending upwards from a bulk silicon portion, wherein each silicon fin of said plurality of silicon fins is separated by a trench isolation region;
    recessing a predetermined number of silicon fins of said plurality of silicon fins to provide a plurality of silicon fin portions in an nFET device region and a pFET device region of said bulk silicon portion;
    forming a relaxed silicon germanium alloy fin portion on a topmost surface of each silicon fin portion;
    forming, in any order, a compressively strained silicon-containing germanium alloy fin portion on a topmost surface of each relaxed silicon germanium alloy fin portion in said pFET device region and a tensile strained silicon-containing fin portion on a topmost surface of each relaxed silicon germanium alloy fin portion in said nFET device region; and
    recessing each trench isolation region to provide trench isolation structures and to partially expose sidewall surfaces of each compressively strained silicon-containing germanium alloy fin portion and each tensile stained silicon fin portion, wherein some of said silicon fins are non-recessed and each of said non-recessed silicon fins has a topmost surface that is coplanar with a topmost surface of each of said compressively strained silicon-containing germanium alloy fin portion and said tensile strained silicon-containing fin portion, and wherein a low leakage functional gate structure is formed on exposed sidewall surfaces and said topmost surface of each of said non-recessed silicon fin.

2. The method of claim 1, wherein said forming said plurality of silicon fins extending upwards from said bulk silicon portion comprises:
    providing a structure including, from bottom to top, a hard mask layer and a bulk silicon substrate;
    forming a plurality of trenches in said hard mask layer and said bulk silicon substrate; and
    filling each of said trenches with a trench dielectric material.

3. The method of claim 2, wherein prior to performing said etching process, a block mask is formed on some of the silicon fins in a region of the bulk silicon portion other than said nFET device region and said pFET device region.

4. The method of claim 1, wherein said recessing said predetermined number of silicon fins of said plurality of silicon fins comprises an etching process.

5. The method of claim 1, wherein said forming said relaxed silicon germanium alloy fin portion comprises an epitaxial semiconductor regrowth process.

6. The method of claim 5, wherein each relaxed silicon germanium alloy fin portion comprises a lower portion having a first defect density and an upper portion having a second defect density that is less than the first defect density.

7. The method of claim 1, wherein said forming the compressively strained silicon-containing germanium alloy fin portion is performed prior to forming said tensile strained silicon-containing fin portion and a block mask is used to protect the nFET device region during said forming of said compressively strained silicon-containing germanium alloy fin portion.

8. The method of claim 1, wherein said forming the tensile strained silicon-containing fin portion is performed prior to forming said compressively strained silicon-containing germanium alloy fin portion and a block mask is used to protect the pFET device region during said forming of said tensile strained silicon-containing fin portion.

9. The method of claim 1, wherein said forming said compressively strained silicon-containing germanium alloy fin portion comprises an epitaxial deposition process and said forming said tensile strained silicon-containing fin portion comprises another epitaxial deposition process.

10. The method of claim 1, further comprising forming a functional gate structure on exposed sidewall surfaces and a topmost surface of said compressively strained silicon-containing germanium alloy fin portion, and forming another functional gate structure on exposed sidewall surfaces and a topmost surface of said tensile strained silicon-containing fin portion.

11. The method of claim 2, wherein after forming said compressively strained silicon-containing germanium alloy fin portion and said forming said tensile strained silicon-containing fin portion, said block mask is removed to expose another predetermined number of silicon fins, and wherein after said recessing said trench isolation structures, a further functional gate structure is formed on exposed sidewall surfaces and a topmost surface of each silicon fin.

12. The method of claim 1, wherein said compressively strained silicon-containing germanium alloy fin portion, said relaxed silicon germanium alloy fin portion and said silicon fin portions in said pFET device region have sidewall surfaces that are vertically coincident to each other.

13. The method of claim 1, wherein said tensile strained silicon-containing fin portion, said relaxed silicon germanium alloy fin portion, and said silicon fin portions in said nFET device region have sidewall surfaces that are vertically coincident to each other.

14. The method of claim 1, wherein each relaxed silicon germanium alloy fin portion contains threading dislocations.

15. The method of claim 14, wherein said threading dislocations in each of said relaxed silicon germanium alloy fin portions terminate at a sidewall of one of said trench isolation structures.

16. The method of claim 1, wherein each relaxed silicon germanium alloy fin portion has a relaxation value of 90% or greater, and a germanium content of 20 atomic percent or greater.

17. The method of claim 1, wherein said compressively strained silicon-containing germanium alloy fin portion contains a greater amount of germanium than said relaxed silicon germanium alloy fin portion in said pFET device region.

18. The method of claim 1, wherein said tensile strained silicon-containing fin portion consists of unalloyed silicon.

19. The method of claim 1, wherein said tensile strained silicon-containing fin portion consists of a silicon germanium alloy having a germanium content that is less than a germanium content of said relaxed silicon germanium alloy fin portion in said nFET device region.

20. A method of forming a semiconductor structure comprising:
   forming a plurality of silicon fins extending upwards from a bulk silicon portion, wherein each silicon fin of said plurality of silicon fins is separated by a trench isolation region;
   recessing a predetermined number of silicon fins of said plurality of silicon fins to provide a plurality of silicon fin portions in an nFET device region and a pFET device region of said bulk silicon portion;
   forming a relaxed silicon germanium alloy fin portion on a topmost surface of each silicon fin portion;
   forming, in any order, a compressively strained silicon-containing germanium alloy fin portion on a topmost surface of each relaxed silicon germanium alloy fin portion in said pFET device region and a tensile strained silicon-containing fin portion on a topmost surface of each relaxed silicon germanium alloy fin portion in said nFET device region; and
   recessing each trench isolation region to provide trench isolation structures and to partially expose sidewall surfaces of each compressively strained silicon-containing germanium alloy fin portion and each tensile stained silicon fin portion, wherein said tensile strained silicon-containing fin portion consists of a silicon germanium alloy having a germanium content that is less than a germanium content of said relaxed silicon germanium alloy fin portion in said nFET device region.

* * * * *